United States Patent
Lee et al.

(10) Patent No.: US 12,544,806 B2
(45) Date of Patent: Feb. 10, 2026

(54) WAFER CLEANING APPARATUS

(71) Applicant: ZEUS CO., LTD., Hwaseong-si (KR)

(72) Inventors: Sanghoon Lee, Suwon-si (KR); Jiho Park, Hwaseong-si (KR); Woon Kong, Cheonan-si (KR); Ungjo Moon, Osan-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 354 days.

(21) Appl. No.: 18/122,498

(22) Filed: Mar. 16, 2023

(65) Prior Publication Data

US 2023/0294144 A1 Sep. 21, 2023

(30) Foreign Application Priority Data

Mar. 16, 2022 (KR) .................. 10-2022-0032745

(51) Int. Cl.
*B08B 3/12* (2006.01)
*H01L 21/67* (2006.01)
*B06B 1/02* (2006.01)

(52) U.S. Cl.
CPC .......... *B08B 3/123* (2013.01); *H01L 21/6704* (2013.01); *B06B 1/02* (2013.01)

(58) Field of Classification Search
CPC ....................................... B08B 3/123
See application file for complete search history.

(56) References Cited

U.S. PATENT DOCUMENTS

| 6,431,184 B1 | 8/2002 | Taniyama |
| 2017/0043379 A1* | 2/2017 | Sasaki ................. H01L 21/6708 |

FOREIGN PATENT DOCUMENTS

| CN | 109890520 | | 6/2019 |
| JP | 2014116480 A | * | 6/2014 |
| JP | 2018-046259 | | 3/2018 |
| KR | 10-2012-0018296 | | 3/2012 |
| KR | 10-2019-0113878 | | 10/2019 |
| KR | 10-2022-0027011 | | 3/2022 |

OTHER PUBLICATIONS

Miura et al., JP-2014116480-A English machine translation, Jun. 2014 (Year: 2014).*

* cited by examiner

*Primary Examiner* — Jason Y Ko
(74) *Attorney, Agent, or Firm* — KILE PARK REED & HOUTTEMAN PLLC

(57) ABSTRACT

A wafer cleaning apparatus according to the present disclosure includes a rotary table that supports and rotates a wafer so that the wafer rotates about a rotational axis, and an ultrasonic vibration device that vibrates a liquid film so that vibration having an ultrasonic frequency is generated in the liquid film formed on an upper surface of the wafer.

18 Claims, 7 Drawing Sheets

WAFER CLEANING APPARATUS

CROSS-REFERENCE TO RELATED APPLICATION

This application claims priority to and the benefit of Korean Patent Application No. 10-2022-0032745 filed on Mar. 16, 2022, the disclosure of which is incorporated herein by reference in its entirety.

BACKGROUND

1. Field of the Invention

The present disclosure relates to a wafer cleaning apparatus, and more particularly, to a wafer cleaning apparatus that cleans a surface of a wafer using ultrasonic vibration.

2. Discussion of Related Art

A semiconductor manufacturing process includes a cleaning process of cleaning a surface of a wafer. An example of a wafer cleaning apparatus that cleans the wafer includes an ultrasonic cleaning apparatus that removes foreign substances from the surface of the wafer by vibrating a cleaning liquid using ultrasonic waves. Among the ultrasonic waves, high-frequency ultrasonic waves having a frequency of 700 kHz or more are called megasonic waves. Accordingly, an apparatus that cleans the surface of the wafer using vibration of the megasonic waves is classified as a megasonic cleaning apparatus, and an apparatus that cleans the surface of the wafer using vibration of ultrasonic waves having a frequency of 20 kHz to 400 kHz lower than the frequency of the megasonic waves is classified as an ultrasonic wave cleaning apparatus.

The ultrasonic wave cleaning apparatus may include a rotary table that supports and rotates the wafer, a cleaning liquid discharge part that discharges a cleaning liquid to the wafer to form a liquid film on the surface of the wafer, and an ultrasonic vibration part that ultrasonically vibrates the cleaning liquid. However, in an ultrasonic wave cleaning apparatus according to the related art, the liquid film formed on the surface of the wafer is non-uniform, a partial deviation of a cleaning effect over an entire area of the wafer is large, and frequent damage to the surface of the wafer occurs, thus reducing the yield of non-defective semiconductor products.

The background technology of the present disclosure is disclosed in Korean Patent Application Publication No. 10-2012-0018296 (published on Mar. 2, 2012, Title of the Invention: Semiconductor wafer cleaning method and apparatus).

SUMMARY OF THE INVENTION

The present disclosure is directed to providing a wafer cleaning apparatus in which a liquid film of a cleaning liquid is uniformly formed on a surface of a wafer, a cleaning effect is improved, and damage to the surface of the wafer is suppressed.

The present disclosure provides a wafer cleaning apparatus including a rotary table that supports and rotates a wafer so that the wafer rotates about a rotational axis, and an ultrasonic vibration device that vibrates a liquid film so that vibration having an ultrasonic frequency is generated in the liquid film formed on an upper surface of the wafer.

The wafer cleaning apparatus may further include a cleaning liquid discharge device that discharges the cleaning liquid so that the liquid film is formed on the upper surface of the wafer.

When the ultrasonic vibration device is operated, the cleaning liquid may be not discharged from the cleaning liquid discharge device.

During operation of the ultrasonic vibration device, the cleaning liquid may be discharged from the cleaning liquid discharge device.

The cleaning liquid discharge device may include a first discharge part that is positioned around one side of the ultrasonic vibration device and discharges the cleaning liquid, and the cleaning liquid discharged from the first discharge part may introduce into a lower portion of the ultrasonic vibration device by a rotation of the wafer.

A planar shape of the ultrasonic vibration device may be a quadrangular shape extending in a radial direction of the wafer, and the first discharge part may extend parallel to a longitudinal direction of the ultrasonic vibration device The cleaning liquid discharge device may further include a second discharge part that is positioned around a first end of both ends of the ultrasonic vibration device in a longitudinal direction, which is closer to the rotational axis, discharges the cleaning liquid, and extends parallel to a width direction of the ultrasonic vibration device.

The cleaning liquid may be discharged only from the first discharge part and not from the second discharge part.

The cleaning liquid may be discharged only from the second discharge part and not from the first discharge part.

The cleaning liquid may be discharged from both the first discharge part and the second discharge part.

A shortest distance between the rotational axis and the second discharge part may be smaller than a shortest distance between the rotational axis and the first discharge part.

A plurality of discharge ports through which the cleaning liquid is discharged may be formed in a lower surface of the cleaning liquid discharge device, and the cleaning liquid may be discharged from the plurality of discharge ports in a direction perpendicular to the upper surface of the wafer or discharged from the plurality of discharge ports in an inclined direction so as to approach the ultrasonic vibration device as it goes downward.

The plurality of discharge ports may be arranged spaced apart by a same distance.

The plurality of discharge ports may be arranged spaced apart by a different distance.

A height from the upper surface of the wafer to a lower surface of the cleaning liquid discharge device may be greater than a height from the upper surface of the wafer to a lower surface of the ultrasonic vibration device.

The ultrasonic vibration device may vibrate the liquid film so that vibration having a frequency of 700 kHz to 1200 kHz is generated in the liquid film.

As a rotational speed of the wafer increases, a discharge flow rate of the cleaning liquid discharged from the cleaning liquid discharge device may increase.

The rotational speed of the wafer may be in a range of 100 revolution per minute (rpm) to 500 rpm, and the discharge flow rate of the cleaning liquid may be in a range of 2 liters per minute (l/min) to 7 l/min.

The wafer may be adsorbed to and supported by the rotary table by means of a ring frame including an adhesive sheet that adhesively supports the wafer and a retainer ring that is coupled to an outer circumferential portion of the adhesive sheet so that a tensile force of the adhesive sheet is maintained.

The cleaning liquid may flow in a direction along a direction in which the wafer rotates after being discharged from the first discharge part and be introduced into a lower portion of the ultrasonic vibration device.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, a wafer cleaning apparatus according to an embodiment of the present invention will be described with reference to the accompanying drawings. Terms used in the present specification are used to properly express the embodiments of the present disclosure or and the terms may change depending on the intention of a user or an operator or customs in the field to which the present disclosure belongs. Therefore, definitions of the present terms should be made based on the contents throughout the present specification.

Figure 1:
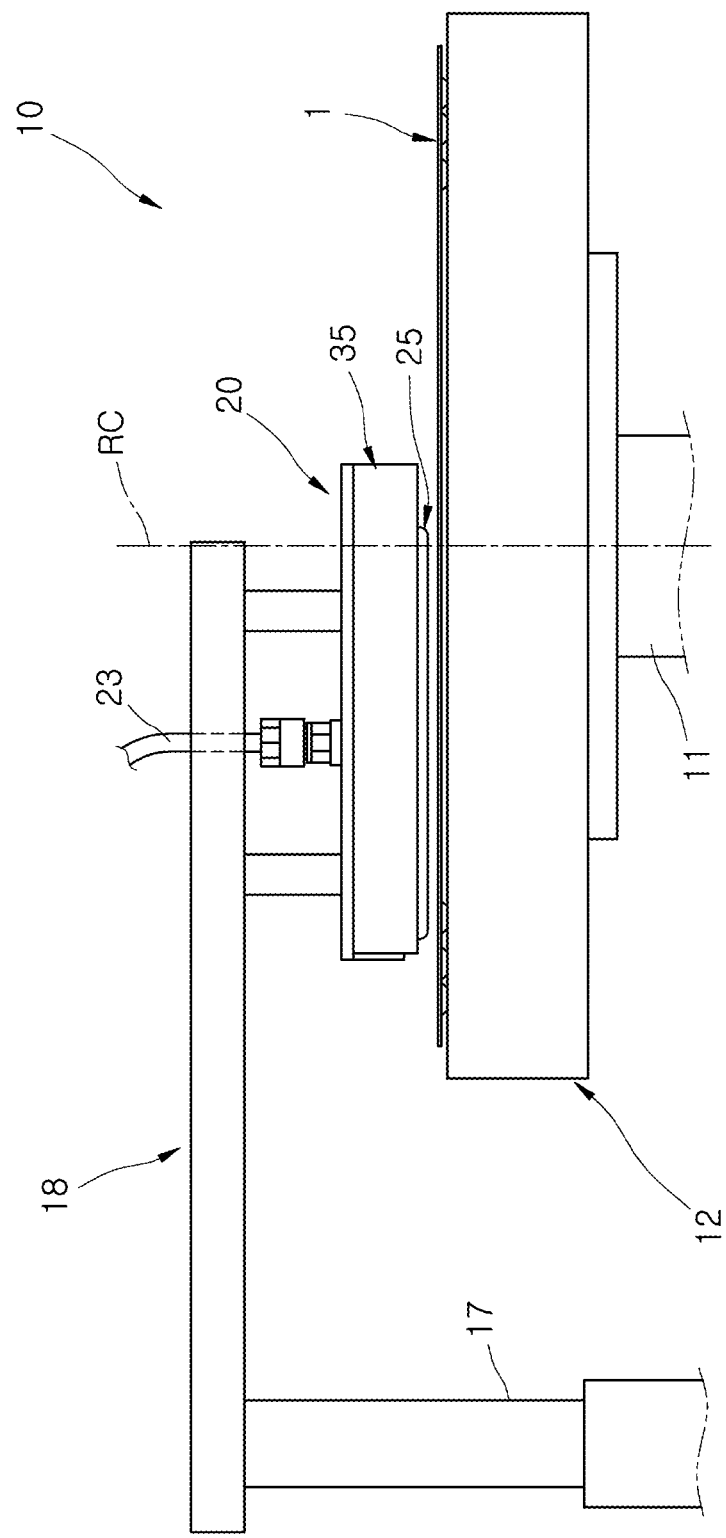
FIG. 1 is a schematic view of a wafer cleaning apparatus according to an embodiment of the present disclosure.
Figure 2:
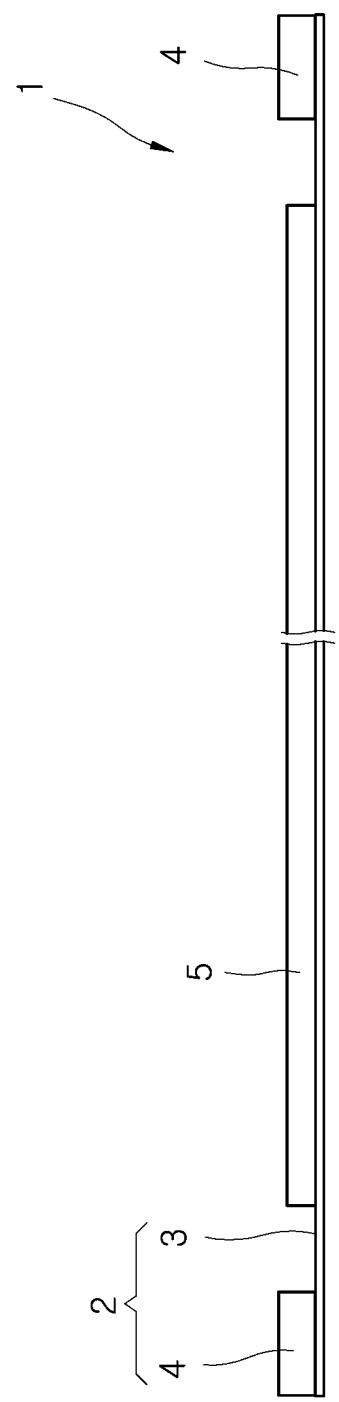
FIG. 2 is a cross-sectional view of a wafer assembly of FIG. 1.
Figure 3:
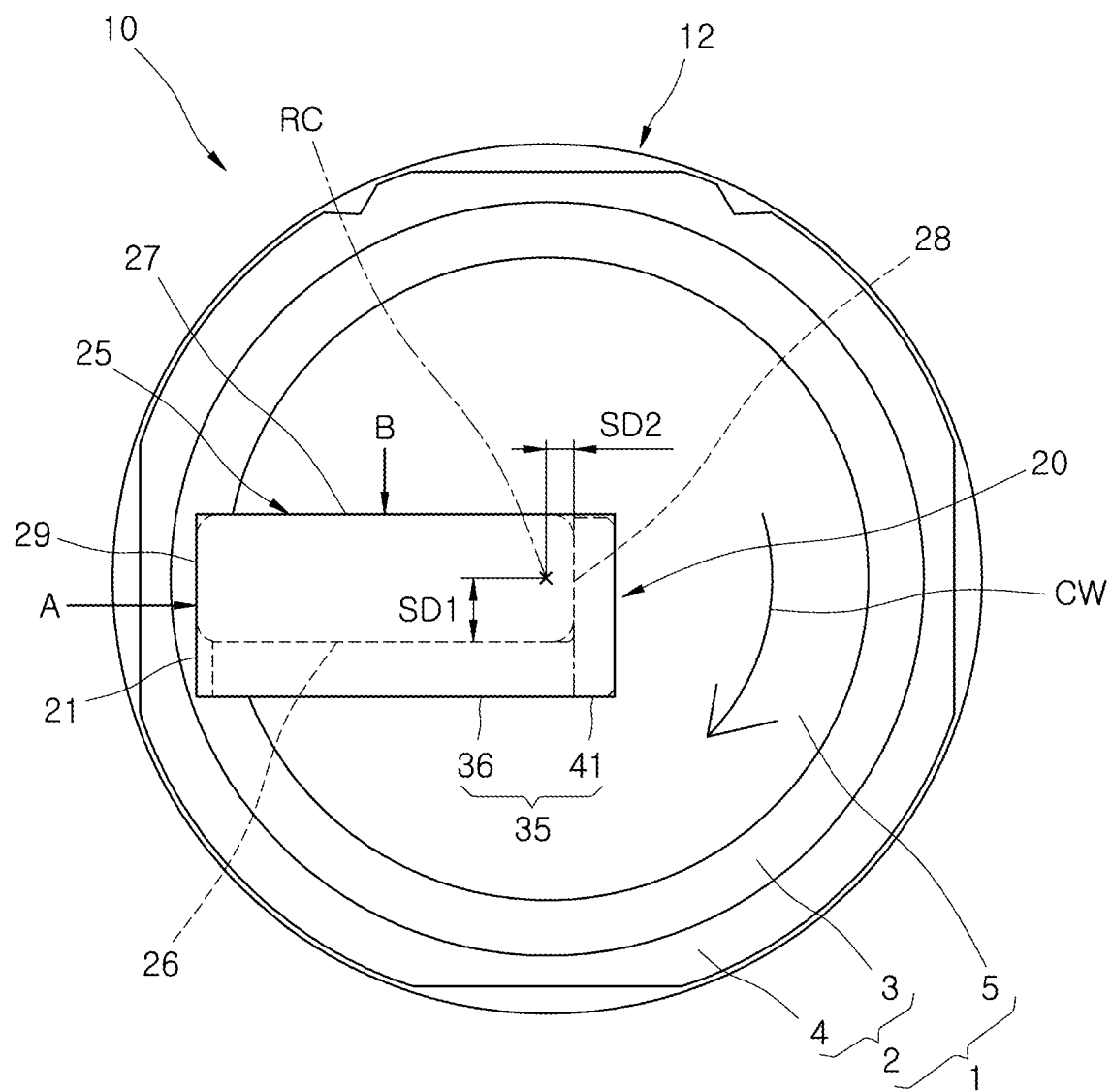
FIG. 3 is a plan view of the wafer cleaning apparatus of FIG. 1.
Figure 4:
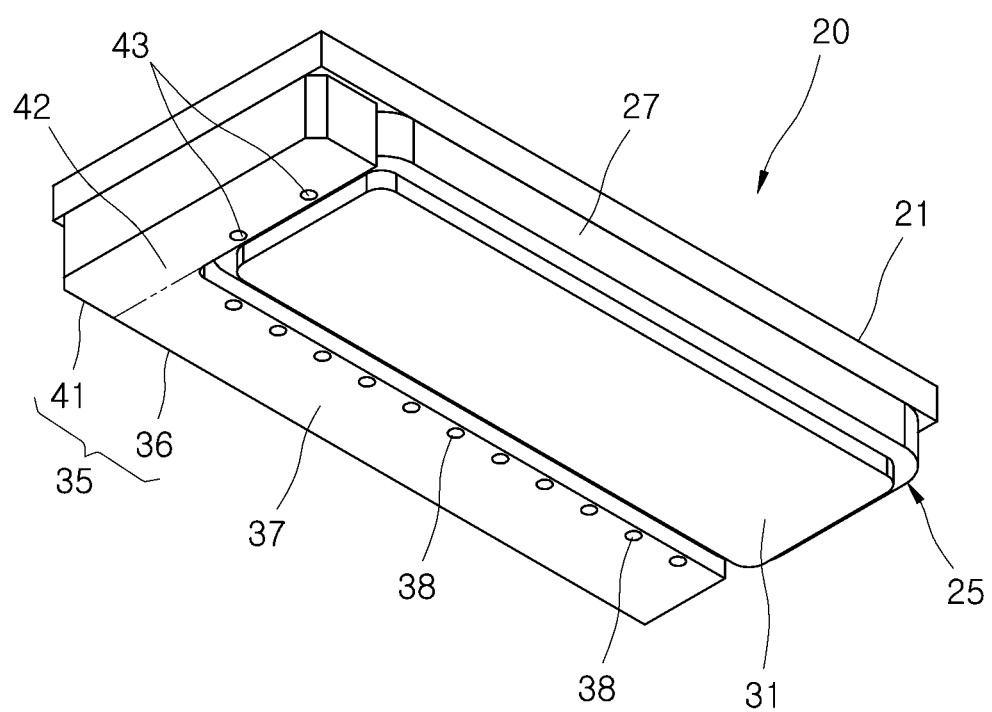
FIG. 4 is a perspective view illustrating a cleaning module of FIG. 3 when viewed from below.
Figure 5:
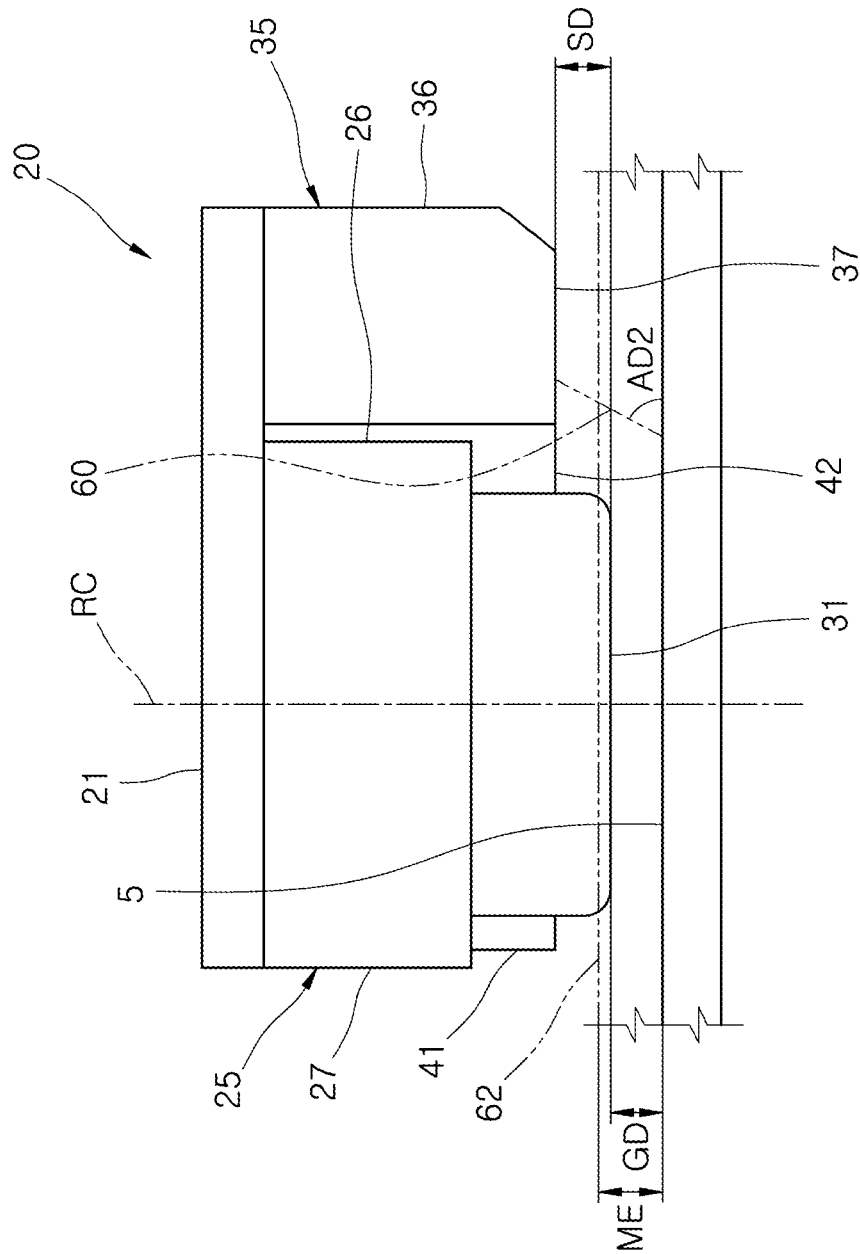
FIGS. 5 and 6 are side views of FIG. 3 when viewed in direction A and direction B.
Figure 6:
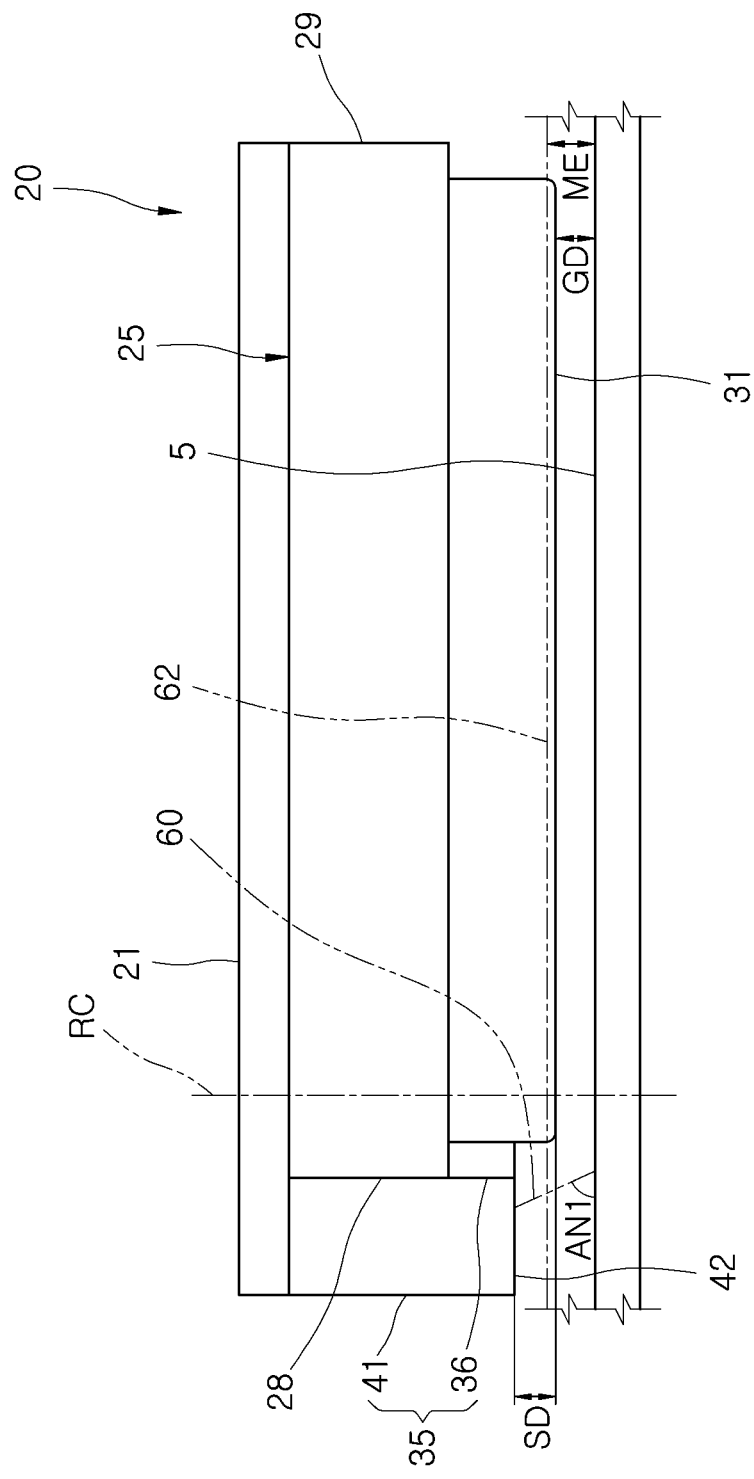

FIG. 1 is a schematic view of a wafer cleaning apparatus according to an embodiment of the present disclosure, FIG. 2 is a cross-sectional view of a wafer assembly of FIG. 1, FIG. 3 is a plan view of the wafer cleaning apparatus of FIG. 1, FIG. 4 is a perspective view illustrating a cleaning module of FIG. 3 when viewed from below, and FIGS. 5 and 6 are side views of FIG. 3 when viewed in direction A and direction B.

Referring to FIGS. 1 to 6 together, a wafer cleaning apparatus 10 according to an embodiment of the present disclosure includes a rotary table 12 and a cleaning module 20.

The rotary table 12 supports and rotates the disk-shaped wafer 5 formed of, for example, silicon (Si) so that the wafer 5 rotates about a rotational axis RC.

The wafer 5 is attached to and supported by a ring frame 2 including an adhesive sheet 3 that adhesively supports the wafer 5 and a retainer ring 4 that is coupled to an outer circumferential portion of the adhesive sheet 3 so that a tensile force of the adhesive sheet 3 is maintained, and the ring frame 2 is adsorbed to and supported by an upper surface of the rotary table 12.

In other words, the wafer 5 is adsorbed to and supported by the rotary table 12 by means of the ring frame 2. Hereinafter, the wafer 5 and the ring frame 2 that attaches and supports the wafer 5 are collectively referred to as a wafer assembly 1. The rotary table 12 may be fixedly supported by the rotary shaft 11 that rotates about the rotational axis RC at a high speed by power of an electric motor.

The cleaning module 20 may include an ultrasonic vibration device 25. The cleaning module 20 may further include a cleaning liquid discharge device 35

The cleaning module 20 is fixedly supported on a first end of a swing arm 18 having a second end coupled to an upper end of an arm shaft 17 positioned outside the rotary table 12. The swing ram 18 rotates about the arm shaft 17.

When the wafer assembly 1 is loaded on or unloaded from the rotary table 12, the swing arm 18 rotates so that the cleaning module 20 moves away from the upper surface of the rotary table 12, and when the wafer assembly 1 is loaded on the rotary table 12, the swing arm 18 rotates so that the cleaning module 20 overlaps the upper surface of the rotary table 12. A support body 21 is fixedly supported by the first end of the swing arm 18. The cleaning module 20 may further include the support body 21 that fixedly supports the cleaning liquid discharge device 35.

The cleaning liquid discharge device 35 discharges a cleaning liquid 60 so that a liquid film 62 of the cleaning liquid 60 is formed on an upper surface of the wafer 5. The ultrasonic vibration device 25 vibrates the liquid film 62 so that vibration having an ultrasonic frequency is generated in the liquid film 62. The ultrasonic vibration device 25 may vibrate the liquid film 62 to generate vibration having a frequency of 700 kHz to 1200 kHz, that is, vibration of megasonic waves, in the liquid film 62 such that the surface of the wafer 5 is cleaned.

The ultrasonic vibration device 25 generates ultrasonic vibration in the liquid film 62 by vibrating ultrasonically while a lower surface 31 thereof is submerged in the liquid film 62 formed on the upper surface of the wafer 5. Thus, a liquid level ME of the liquid film 62 is greater than a height GD between the upper surface of the wafer 5 and the lower surface 31 of the ultrasonic vibration device 25. When the height GD between the upper surface of the wafer and the lower surface 31 of the ultrasonic vibration device 25 is too small, the lower surface 31 and the wafer 5 collide with each other during operation of the ultrasonic vibration device 25, and thus the wafer may be damaged. In contrast, when the height GD between the upper surface of the wafer 5 and the lower surface 31 of the ultrasonic vibration device 25 is too large, a discharge flow rate of the cleaning liquid 60 and an intensity of the ultrasonic vibration may excessively increase.

A planar shape of the ultrasonic vibration device 25 is substantially rectangular, and the ultrasonic vibration device 25 extends in a radial direction of the wafer 5. When the cleaning module 20 operates, the ultrasonic vibration device 25 is positioned such that the rotational axis RC passes through the ultrasonic vibration device 25. In this position, one boundary 28 of the ultrasonic vibration device 25 in a longitudinal direction is positioned closer to the rotational axis RC than an outer circumference of the wafer 5, and the other boundary 29 of the ultrasonic vibration device 25 in the longitudinal direction is positioned closer to the outer circumference of the wafer 5 than the rotational axis RC or positioned outside the outer circumference of the wafer 5.

When the ultrasonic vibration device 25 is operated, the cleaning liquid 60 is not discharged from the cleaning liquid discharge device 35. Also, during operation of the ultrasonic vibration device 25, the cleaning liquid 60 is discharged from the cleaning liquid discharge device 35.

The wafer cleaning apparatus 10 may further include a cleaning liquid supply unit 23 that supplies the cleaning liquid 60 to the cleaning liquid discharge device 35. The cleaning liquid supply unit 23 may include a tube or hose that forms a flow path for the cleaning liquid 60. The cleaning liquid 60 may be, for example, deionized water DIW.

A planar shape of the cleaning liquid discharge device 35 has substantially an "L" shape, and the cleaning liquid discharge device 35 may include a first discharge part 36 and a second discharge part 41 integrally coupled.

The first discharge part 36 is positioned around one boundary 26 of the ultrasonic discharge device 25 in a width direction and extends parallel to the longitudinal direction of the ultrasonic vibration device 25.

The second discharge part 41 is positioned around a first end closer to the rotational axis RC among both ends of the ultrasonic vibration device 25 in the longitudinal direction. In other words, the second discharge part 41 is positioned around the one boundary 28 of the ultrasonic vibration device 25 in the longitudinal direction. The second discharge part 41 extends parallel to the width direction of the ultrasonic vibration device 25.

A plurality of discharge ports 38 that discharge the cleaning liquid 60 to the upper surface of the wafer 5 may be formed in a lower surface 37 of the first discharge part 36. A plurality of discharge ports 43 that discharge the cleaning liquid 60 to the upper surface of the wafer 5 may be formed in a lower surface 42 of the second discharge part 41.

The plurality of discharge ports 38 of the first discharge part 36 are provided around an edge of the first discharge part 36, which is close to the one boundary 26 of the ultrasonic vibration device 25 in the width direction, and may be arranged spaced apart from each other on a virtual straight line parallel to the longitudinal direction of the ultrasonic vibration device 25. As shown in FIG. 4, the plurality of discharge ports 38 may be arranged spaced apart by a same distance. Also, the plurality of discharge ports 38 may be arranged spaced apart by a different distance.

The plurality of discharge ports 43 of the second discharge part 41 are provided around an edge of the second discharge part 41, which is close to the one boundary 28 of the ultrasonic vibration device 25 in the longitudinal direction, and may be arranged spaced apart from each other on a virtual straight line parallel to the width direction of the ultrasonic vibration device 25. The plurality of discharge ports 43 may be arranged spaced apart by a same distance. Also, the plurality of discharge ports 43 may be arranged spaced apart by a different distance.

The cleaning liquid 60 may be discharged only from the plurality of discharge ports 38 of the first discharge part 36, only from the plurality of discharge ports 43 of the second discharge part 41, or simultaneously from the plurality of discharge ports 38 of the first discharge part 36 and the plurality of discharge ports 43 of the second discharge part 41.

That is, the cleaning liquid 60 may be discharged only from the plurality of discharge ports 38 of the first discharge part 36 and not from the plurality of discharge ports 43 of the second discharge part 41. Conversely, the cleaning liquid 60 may be discharged only from the plurality of discharge ports 43 of the second discharge part 41 and not from the plurality of discharge ports 38 of the first discharge part 36.

If a large amount of the cleaning liquid 60 is required, the cleaning liquid 60 may be discharged from both the plurality of discharge ports 38 of the first discharge portion 36 and the plurality of discharge ports 43 of the second discharge portion 41.

As the wafer 5 rotates while being supported by the rotary table 12, the cleaning liquid 60 discharged from at least one of the plurality of discharge ports 38 of the first discharge part 36 and the plurality of discharge ports 43 of the second discharge part 41 to the upper surface of the wafer flows in a direction along the rotational direction of the wafer 5. That is, the cleaning liquid 60 discharged from at least one of the first discharge part 36 and the second discharge part 41 introduces into a lower portion of the ultrasonic vibration device 25 by a rotation of the wafer 5. Therefore, the cleaning liquid 60 discharged from the plurality of discharge ports 38 of the first discharge part 36 is introduced into the lower portion of the lower surface 31 of the ultrasonic vibration device 25 across the one boundary 26 of the ultrasonic vibration device 25 in the width direction immediately after being discharged and is ultrasonically vibrated.

The cleaning liquid 60 ultrasonically vibrated below the lower surface 31 of the ultrasonic vibration device 25 flows outward of the ultrasonic vibration device 25 across the other boundary 27 of the ultrasonic vibration device 25 in the width direction in a direction along a direction in which the wafer 5 rotates. Accordingly, ultrasonic vibration energy is diffused up to an upper surface of an outer circumference of the wafer 5 spaced far from the ultrasonic vibration device 25, thereby increasing cleaning power of the upper surface of the wafer 5 and uniformity of a cleaning effect over the entire area of the wafer 5.

When the first discharge part 36 is positioned to be spaced apart from the ultrasonic vibration device 25 by 180 degrees with respect to the rotational axis RC, a large amount of the cleaning liquid 60 discharged from the first discharge part 36 is not introduced into the lower portion of the ultrasonic vibration device 25, is thus not vibrated, flows outward of the wafer 5, and is lost.

In particular, since a flow rate of the cleaning liquid 60 flowing while forming the liquid film 62 on the upper surface of the wafer 5 is smaller than a flow rate of the cleaning liquid 60 immediately after being discharged from the first discharge part 36, the large amount of the cleaning liquid 60 may not be introduced into the lower portion of the ultrasonically vibrating ultrasonic vibration device 25, may not be thus vibrated, may flow along a circumference of the lower surface 31 of the ultrasonic vibration device 25, and may be discharged to the outside of the wafer 5. Thus, the cleaning effect may be degraded.

The cleaning liquid 60 discharged from the plurality of discharge ports 43 of the second discharge part 41 is introduced into a portion of an area of the lower surface 31 of the ultrasonic vibration device 25, which is close to the rotational axis RC, and is ultrasonically vibrated. Accordingly, cleaning power in an area of the upper surface of the wafer 5, which is close to the rotational axis RC, is reinforced. A shortest distance SD2 between the rotational axis RC and the second discharge part 41 is smaller than a shortest distance SD1 between the rotational axis RC and the first discharge part 36. When the shortest distance SD2 is greater than the shortest distance SD1, a width of the ultrasonic vibration device 25 is reduced, and thus an area in which the ultrasonic vibration is generated is too small or the cleaning liquid 60 discharged from the second discharge part 41 is discharged to a point spaced apart from the rotational axis RC. Thus, the cleaning power in the area close to the rotational axis RC cannot be reinforced.

The lower surfaces 37 and 42 of the first discharge part 36 and the second discharge part 41 are positioned higher than the lower surface 31 of the ultrasonic vibration device 25 by a preset step SD. In other words, a height GD+SD from the upper surface of the wafer 5 to the lower surfaces 37 and 42 of the cleaning liquid discharge device 35 is higher than the height GD from the upper surface of the wafer 5 to the lower surface 31 of the ultrasonic vibration device 25.

Foreign substances generated in the wafer 5 due to the ultrasonic cleaning by the ultrasonic vibration device 25 may contaminate the discharge ports 38 and 43. In this case, when the lower surfaces 37 and 42 of the first discharge part 36 and the second discharge part 41 are not positioned higher than the lower surface 31 of the ultrasonic vibration device 25, the wafer 5 may be contaminated by the contaminated discharge ports 38 and 43 in a subsequent process after the ultrasonic cleaning. The size of the step SD may be in a range of, for example, 3 mm to 8 mm.

The cleaning liquid 60 discharged from the plurality of discharge ports 38 and 43 is discharged from the plurality of discharge ports 38 and 43 in a direction perpendicular to the upper surface of the wafer 5 or discharged from the plurality of discharge ports 38 and 43 in an inclined direction so that the cleaning liquid 60 becomes closer to the ultrasonic vibration device 25 as it goes downward, that is, it goes closer to the upper surface of the wafer 5.

When the cleaning liquid 60 is discharged in a direction away from the ultrasonic vibration device 25 as it goes downward, the cleaning liquid 60 is not introduced into the lower portion of the ultrasonic vibration device 25 and is discharged to the outside of the wafer 5, and thus the amount of loss not contributing to the cleaning of the wafer 5 increases. Incident angles AN1 and AN2 at which the cleaning liquid 60 discharged from the discharge ports 38 and 43 is incident on the upper surface of the wafer 5 may be in a range of, for example, 40° to 90°. The incident angles AN1 and AN2 may be determined through a test.

Since a sufficient amount of the cleaning liquid 60 is dispersed and supplied to the upper surface of the wafter through the plurality of discharge ports 38 and 43 of the cleaning liquid discharge device 35, the ultrasonically vibrated uniform liquid film 62 is formed on the upper surface of the wafer 5, damage to the upper surface of the wafer 5 is suppressed, and accordingly, the yield of non-defective semiconductor products is also improved.

When a rotational speed of the wafer 5 is too small, a centrifugal force is too small, the cleaning liquid 60 including the foreign substances removed from the wafer 5 is not smoothly discharged to the outside of the wafer 5, and accordingly, the wafer 5 may be re-contaminated by the foreign substances.

When the rotational speed of the wafer 5 is too high, the centrifugal force is too large, the liquid film 62 is not appropriately formed on the upper surface of the wafer 5 at the liquid level ME, and thus the cleaning effect may be degraded. When the wafer 5 having a diameter of about 300 mm and used in a semiconductor manufacturing process is supported by and rotated with the rotary table 12, the rotational speed of the wafer 5 may be in a range of 100 revolution per minute (rpm) to 500 rpm.

As the rotational speed of the wafer 5 increases and the centrifugal force thus increases, a discharge flow rate of the cleaning liquid 60 discharged from the plurality of discharge ports 38 and 43 of the cleaning liquid discharge device 35 increases so that the liquid film 62 is appropriately formed on the upper surface of the wafer 5 at the liquid level ME. For example, when the rotational speed of the wafer 5 is in a range of 100 rpm to 500 rpm, the discharge flow rate of the cleaning liquid 60 of the cleaning liquid discharge device 35 may increase in proportion to the rotational speed of the wafer 5 in a range of 2 liters per minute (l/min) to 7 l/min.

Figure 7:
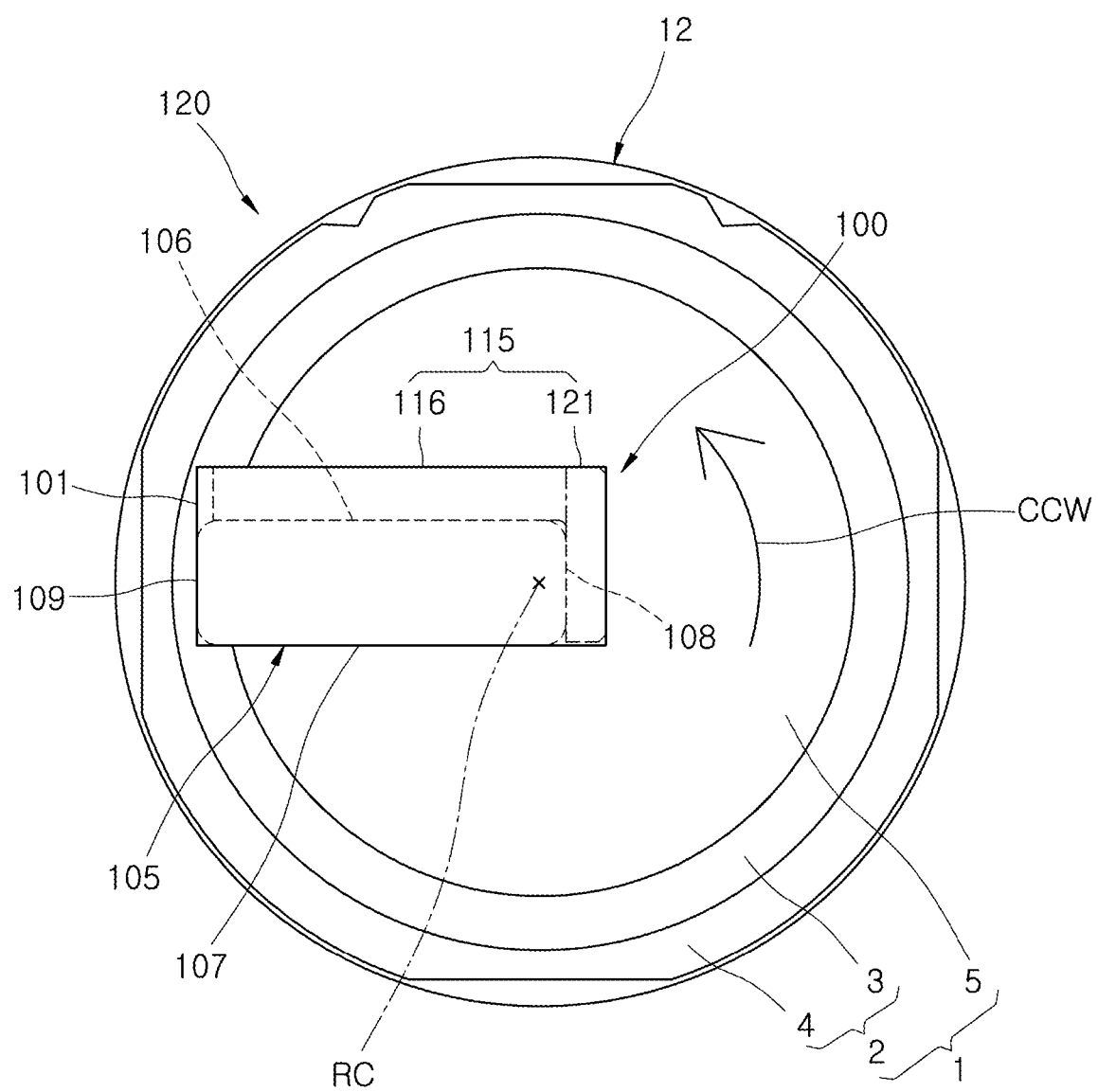
FIG. 7 is a plan view of a wafer cleaning apparatus according to another embodiment of the present disclosure.

FIG. 7 is a plan view of a wafer cleaning apparatus according to another embodiment of the present disclosure. Referring to FIG. 7, like the wafer cleaning apparatus 10 illustrated in FIGS. 1 and 3, a wafer cleaning apparatus 120 according to another embodiment of the present disclosure may include the rotary table 12 that supports and rotations the wafer 5 and a cleaning module 100. The wafer 5 is attached to and supported by the ring frame 2 including the adhesive sheet 3 that adhesively supports the wafer 5 and the retainer ring 4 that is coupled to the outer circumferential portion of the adhesive sheet 3 so that the tensile force of the adhesive sheet 3 is maintained, and the ring frame 2 is adsorbed to and supported by the upper surface of the rotary table 12.

The cleaning module 100 may include an ultrasonic vibration device 105, a cleaning liquid discharge device 115, and a support body 101 that fixedly supports the ultrasonic vibration device 105 and the cleaning liquid discharge device 115. The cleaning liquid discharger 115 discharges the cleaning liquid 60 so that the liquid film 62 of the cleaning liquid 60 is formed on the upper surface of the wafer 5. The ultrasonic vibration device 105 vibrates the liquid film 62 so that vibration having an ultrasonic frequency is generated in the liquid film 62.

A planar shape of the cleaning liquid discharge device 115 has substantially an "L" shape, and the cleaning liquid discharge device 115 may include a first discharge part 116 and a second discharge part 121 integrally coupled. The first discharge part 116 is positioned around one boundary 106 of the ultrasonic vibration device 105 in a width direction and extends parallel to the longitudinal direction of the ultrasonic vibration device 105. The second discharge part 121 is positioned around a first end closer to the rotational axis RC among both ends of the ultrasonic vibration device 105 in the longitudinal direction. In other words, the second discharge part 121 is positioned around one boundary 108 closer to the rotational axis RC among both boundaries 108 and 109 of the ultrasonic vibration device 105 in a longitudinal direction. The second discharge part 121 extends parallel to a width direction of the ultrasonic vibration device 105.

As the wafer 5 rotates while being supported by the rotary table 12, the cleaning liquid 60 discharged from the first discharge part 116 and the second discharge part 121 to the upper surface of the wafer 5 flows in a direction along the rotational direction of the wafer 5. Therefore, the cleaning liquid 60 discharged from the first discharge part 116 is introduced into the lower portion of the lower surface of the ultrasonic vibration device 105 across the one boundary 106 of the ultrasonic vibration device 105 in the width direction immediately after being discharged and is ultrasonically vibrated.

The cleaning liquid 60 ultrasonically vibrated below the lower surface of the ultrasonic vibration device 105 flows outward of the ultrasonic vibration device 105 across the other boundary 107 of the ultrasonic vibration device 105 in the width direction in the forward direction to the direction in which the wafer 5 rotates. Accordingly, the ultrasonic vibration energy is diffused up to the upper surface of the outer circumference of the wafer 5 spaced far from the ultrasonic vibration device 105, thereby increasing the cleaning power of the upper surface of the wafer 5 and the uniformity of the cleaning effect over the entire area of the wafer 5.

In the wafer cleaning apparatuses 10 and 120 illustrated in FIGS. 3 and 7, both the ultrasonic vibration devices 25 and 105 are arranged to extend leftward from the rotational axis RC. However, in the wafer cleaning apparatus 10 illustrated in FIG. 3, since the wafer 5 rotates in a clockwise direction CW, the first discharge part 36 is disposed below the ultrasonic vibration device 25 with respect to FIG. 3 so that the cleaning liquid 60 is introduced into the ultrasonic vibration device 25 without loss immediately after being discharged from the first discharge part 36. In contrast, in the wafer cleaning apparatus 120 illustrated in FIG. 7, since the wafer 5 rotates in a counterclockwise direction CCW, the first discharge part 116 is disposed above the ultrasonic vibration device 105 with respect to FIG. 7 so that the cleaning liquid 60 is introduced into the ultrasonic vibration device 105 without loss immediately after being discharged from the first discharge part 116.

The cleaning liquid 60 discharged from the second discharge part 121 is introduced into a lower portion of an area of a lower surface of the ultrasonic vibration device 105, which is close to the rotational axis RC, and is ultrasonically vibrated. Accordingly, the cleaning power in the area of the upper surface of the wafer 5, which is close to the rotational axis RC, is reinforced.

According to the present disclosure, a cleaning liquid is introduced into a lower portion of an ultrasonic vibration device without loss immediately after being discharged from a cleaning liquid discharge device, is ultrasonically vibrated, flows outward of the ultrasonic vibration device, and diffuses ultrasonic vibration energy up to an outer circumferential portion of a wafer spaced far from the ultrasonic vibration device. Accordingly, wafer cleaning power and uniformity of a cleaning effect over the entire area of the wafer are improved.

Further, according to the present disclosure, since a sufficient flow rate of the cleaning liquid is dispersed and supplied to a surface of the wafer through a plurality of spaced discharge ports, an ultrasonically vibrated uniform liquid film is formed on the surface of the wafer, and thus damage to the surface of the wafer is suppressed, and the yield of non-defective semiconductor products is improved.

Although the present disclosure has been described with reference to one embodiment illustrated in the drawings, the description is merely illustrative, and those skilled in the art to which the technology belongs could understand that various modifications and other equivalent embodiments may be made. Thus, the true technical scope of the present disclosure should be determined only by the appended claims.

What is claimed is:

1. A wafer cleaning apparatus comprising:
   a rotary table that supports and rotates a wafer so that the wafer rotates about a rotational axis;
   a cleaning liquid discharge device that discharges a cleaning liquid so that a liquid film is formed on the upper surface of the wafer; and
   an ultrasonic vibration device that vibrates the liquid film so that vibration having an ultrasonic frequency is generated in the liquid film,
   wherein the cleaning liquid discharge device includes a first discharge part that is positioned around one side of the ultrasonic vibration device and discharges the cleaning liquid, the one side of the ultrasonic vibration device is where the wafer rotates to enter under the ultrasonic vibration device, and
   wherein the cleaning liquid flows in a direction along a direction in which the wafer rotates after being discharged from the first discharge part and is introduced into the lower portion of the ultrasonic vibration device at the one side of the ultrasonic vibration device, and leaves the lower portion of the ultrasonic vibration device at the other side of the ultrasonic vibration device.

2. The wafer cleaning apparatus of claim 1, wherein when the ultrasonic vibration device is operated, the cleaning liquid is not discharged from the cleaning liquid discharge device.

3. The wafer cleaning apparatus of claim 1, wherein during operation of the ultrasonic vibration device, the cleaning liquid is discharged from the cleaning liquid discharge device.

4. The wafer cleaning apparatus of claim 1, wherein:
   the cleaning liquid discharged from the first discharge part introduces into a lower portion of the ultrasonic vibration device by a rotation of the wafer.

5. The wafer cleaning apparatus of claim 4, wherein:
   a planar shape of the ultrasonic vibration device is a quadrangular shape extending in a radial direction of the wafer,
   the first discharge part extends parallel to a longitudinal direction of the ultrasonic vibration device.

6. The wafer cleaning apparatus of claim 5, wherein the cleaning liquid discharge device further includes a second discharge part that is positioned around a first end of both ends of the ultrasonic vibration device in a longitudinal direction, which is closer to the rotational axis, discharges the cleaning liquid, and extends parallel to a width direction of the ultrasonic vibration device.

7. The wafer cleaning apparatus of claim 6, wherein the cleaning liquid is discharged only from the first discharge part and not from the second discharge part.

8. The wafer cleaning apparatus of claim 6, wherein the cleaning liquid is discharged only from the second discharge part and not from the first discharge part.

9. The wafer cleaning apparatus of claim 6, wherein the cleaning liquid is discharged from both the first discharge part and the second discharge part.

10. The wafer cleaning apparatus of claim 6, wherein a shortest distance between the rotational axis and the second discharge part is smaller than a shortest distance between the rotational axis and the first discharge part.

11. The wafer cleaning apparatus of claim 1, wherein a plurality of discharge ports through which the cleaning liquid is discharged are formed in a lower surface of the cleaning liquid discharge device, and
   the cleaning liquid is discharged from the plurality of discharge ports in a direction perpendicular to the upper surface of the wafer or discharged from the plurality of discharge ports in an inclined direction so as to approach the ultrasonic vibration device as it goes downward.

12. The wafer cleaning apparatus of claim 11, wherein the plurality of discharge ports are arranged spaced apart by a same distance.

13. The wafer cleaning apparatus of claim 11, wherein the plurality of discharge ports are arranged spaced apart by a different distance.

14. The wafer cleaning apparatus of claim 1, wherein a height from the upper surface of the wafer to a lower surface of the cleaning liquid discharge device is greater than a height from the upper surface of the wafer to a lower surface of the ultrasonic vibration device.

15. The wafer cleaning apparatus of claim 1, wherein the ultrasonic vibration device vibrates the liquid film so that vibration having a frequency of 700 kHz to 1200 kHz is generated in the liquid film.

16. The wafer cleaning apparatus of claim 1, wherein, as a rotational speed of the wafer increases, a discharge flow rate of the cleaning liquid discharged from the cleaning liquid discharge device increases.

17. The wafer cleaning apparatus of claim 16, wherein the rotational speed of the wafer is in a range of 100 rpm to 500 rpm, and
   the discharge flow rate of the cleaning liquid is in a range of 2 liters per minute (l/min) to 7 l/min.

18. The wafer cleaning apparatus of claim 1, wherein the wafer is adsorbed to and supported by the rotary table by means of a ring frame including an adhesive sheet that adhesively supports the wafer and a retainer ring that is coupled to an outer circumferential portion of the adhesive sheet so that a tensile force of the adhesive sheet is maintained.

* * * * *